United States Patent
Morita et al.

(10) Patent No.: US 11,201,515 B2
(45) Date of Patent: Dec. 14, 2021

(54) MOTOR COIL SUBSTRATE AND METHOD FOR MANUFACTURING MOTOR COIL SUBSTRATE

(71) Applicant: IBIDEN CO., LTD., Ogaki (JP)

(72) Inventors: Haruhiko Morita, Ogaki (JP); Hitoshi Miwa, Ogaki (JP); Shinobu Kato, Ogaki (JP); Toshihiko Yokomaku, Ibi-gun (JP); Hisashi Kato, Ogaki (JP); Takahisa Hirasawa, Ogaki (JP); Tetsuya Muraki, Ogaki (JP); Takayuki Furuno, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 186 days.

(21) Appl. No.: 16/556,265

(22) Filed: Aug. 30, 2019

(65) Prior Publication Data
US 2020/0076263 A1 Mar. 5, 2020

(30) Foreign Application Priority Data
Sep. 3, 2018 (JP) .............................. JP2018-164347

(51) Int. Cl.
*H02K 3/26* (2006.01)
*H02K 3/28* (2006.01)
*H02K 1/02* (2006.01)
*H01F 5/00* (2006.01)
*H02K 13/00* (2006.01)
*H05K 1/02* (2006.01)

(52) U.S. Cl.
CPC .............. *H02K 3/26* (2013.01); *H01F 5/003* (2013.01); *H02K 3/28* (2013.01); *H02K 13/006* (2013.01); *H05K 1/028* (2013.01); *H02K 2203/03* (2013.01)

(58) Field of Classification Search
CPC .......... H02K 3/26; H02K 3/28; H02K 13/006; H02K 2203/03; H02K 11/33; H02K 15/00; H02K 15/0407; H05K 1/028; H05K 1/0393; H05K 1/165; H05K 2201/056; H05K 2201/086; H05K 1/0298; H05K 3/4602; H01F 5/003; H01F 2027/2809
USPC ......................................................... 310/179
See application file for complete search history.

(56) References Cited

U.S. PATENT DOCUMENTS

| | | | | |
|---|---|---|---|---|
| 4,760,294 A * | 7/1988 | Hansen | .................... | H01F 5/003 310/13 |
| 8,035,267 B2 * | 10/2011 | Suzuki | ...................... | H02K 3/26 310/208 |
| 8,610,530 B2 * | 12/2013 | Singh | ....................... | H05B 6/06 336/200 |
| 2019/0115130 A1 * | 4/2019 | Morita | .................... | H05K 1/165 |
| 2020/0076263 A1 * | 3/2020 | Morita | ..................... | H02K 3/28 |
| 2020/0161919 A1 * | 5/2020 | Morita | ..................... | H02K 3/28 |

FOREIGN PATENT DOCUMENTS

JP 2007-124892 A 5/2007

* cited by examiner

*Primary Examiner* — John K Kim
(74) *Attorney, Agent, or Firm* — Oblon, McClelland, Maier & Neustadt, L.L.P.

(57) ABSTRACT

A motor coil substrate includes a flexible substrate, and multiple coils formed on the flexible substrate such that each of the coils has a spiral shape. The flexible substrate has multiple folding lines formed and the multiple coils positioned such that the flexible substrate is folded at the folding lines and wound around a magnet and that an m-th coil and an (m+1)-th coil of the coils partially overlap one another when folded at the folding lines.

20 Claims, 4 Drawing Sheets

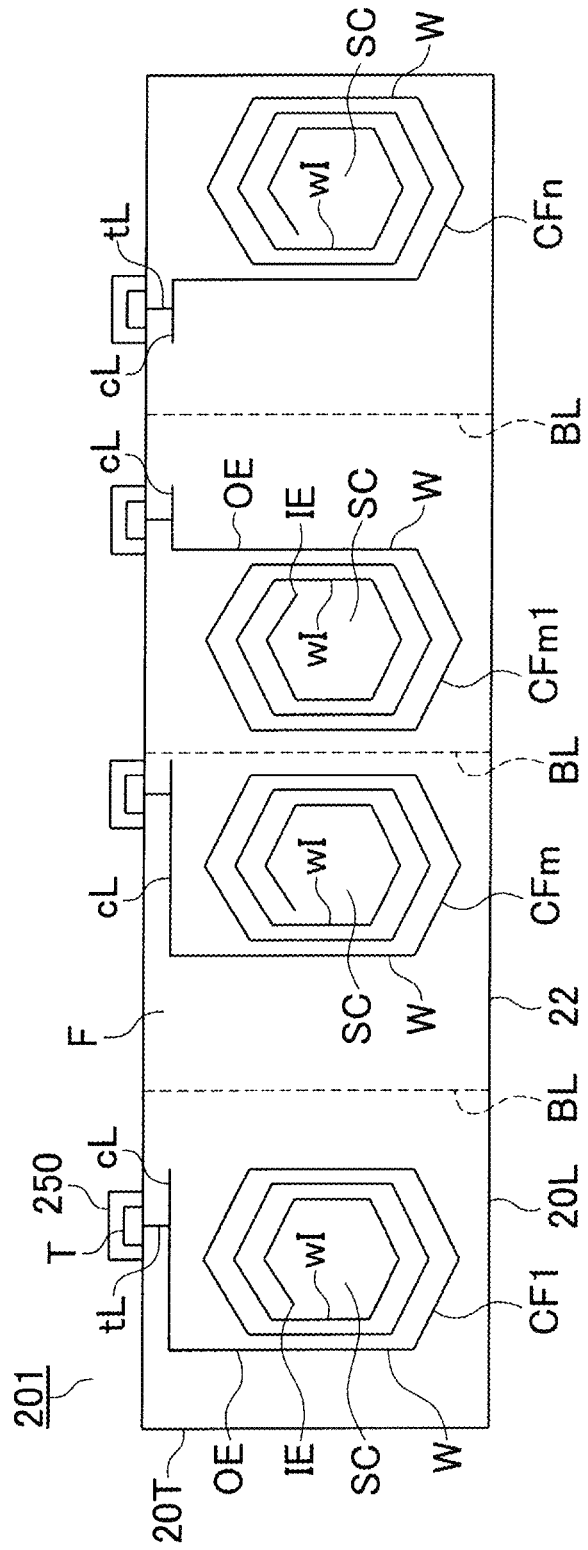

MOTOR COIL SUBSTRATE AND METHOD FOR MANUFACTURING MOTOR COIL SUBSTRATE

CROSS-REFERENCE TO RELATED APPLICATIONS

The present application is based upon and claims the benefit of priority to Japanese Patent Application No. 2018-164347, filed Sep. 3, 2018, the entire contents of which are incorporated herein by reference.

BACKGROUND OF THE INVENTION

Field of the Invention

The present invention relates to a motor coil substrate that includes a flexible substrate and coils formed on the flexible substrate, and relates to a method for manufacturing the motor coil substrate.

Description of Background Art

Japanese Patent Application Laid-Open Publication No. 2007-124892 relates to an electric motor, which includes multiple single coils formed of wires. The entire contents of this publication are incorporated herein by reference.

SUMMARY OF THE INVENTION

According to one aspect of the present invention, a motor coil substrate includes a flexible substrate, and multiple coils formed on the flexible substrate such that each of the coils has a spiral shape. The flexible substrate has multiple folding lines formed and the multiple coils positioned such that the flexible substrate is folded at the folding lines and wound around a magnet and that an m-th coil and an (m+1)-th coil of the coils partially overlap one another when folded at the folding lines.

According to another aspect of the present invention, a motor includes a magnet, and a motor coil substrate including a flexible substrate, and multiple coils formed on the flexible substrate such that each of the coils has a spiral shape. The flexible substrate has multiple folding lines formed and the multiple coils positioned such that the flexible substrate is folded at the folding lines and wound around the magnet and that an m-th coil and an (m+1)-th coil of the coils partially overlap one another.

According to yet another aspect of the present invention, a method for manufacturing a motor coil substrate includes forming multiple coils on a flexible substrate such that each of the coils has a spiral shape, folding the flexible substrate at multiple folding lines such that an m-th coil and an (m+1)-th coil of the coils partially overlap one another, and winding the folded flexible substrate such that the flexible substrate forms a space between a magnet and the flexible substrate wound around the magnet.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 illustrates a first intermediate substrate.

DETAILED DESCRIPTION OF THE EMBODIMENTS

Figure 1A:
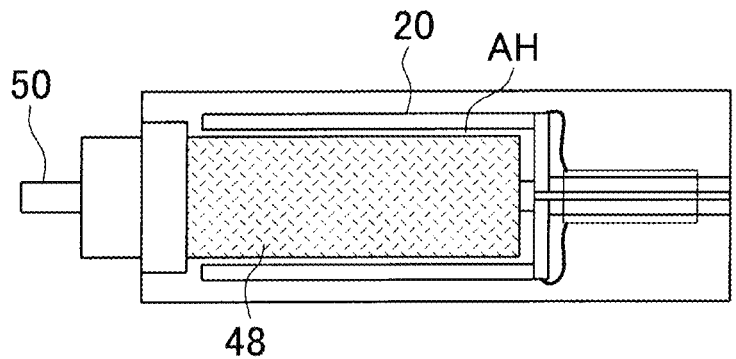
FIG. 1A is a schematic diagram of a motor.

Embodiments will now be described with reference to the accompanying drawings, wherein like reference numerals designate corresponding or identical elements throughout the various drawings.

Embodiment

FIG. 1A is a schematic diagram of a motor 10 that includes a magnet 48 and a motor coil substrate 20 of a first embodiment. The motor coil substrate 20 is positioned around the magnet 48 via a space (AH). An example of the motor 10 is a DC motor. The motor 10 can further have a commutator, a brush and a housing (which are not illustrated in the drawings). In the first embodiment, the coil substrate 20 rotates. However, it is also possible that the magnet 48 rotates.

Figure 1B:
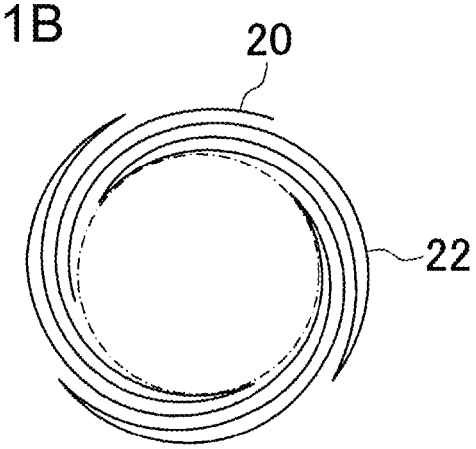
FIG. 1B illustrates a cross section of a flexible substrate.

FIG. 1B illustrates a cross section of the motor coil substrate 20 illustrated in FIG. 1A. FIG. 1B schematically illustrates a flexible substrate 22 forming the motor coil substrate 20. In the embodiment, as illustrated in FIG. 1B, the flexible substrate 22 is folded, and, after that, the folded flexible substrate 22 is positioned around the magnet. For example, the number of the turns of the folded flexible substrate 22 wound around the magnet is 2 or more and 5 or less. The number of the turns is preferably 3. Or, the number of the turns is preferably 4.

FIG. 3 illustrates a first intermediate substrate 201 for forming the motor coil substrate 20 of the embodiment. The first intermediate substrate 201 of FIG. 3 is formed to include the flexible substrate 22 and multiple coils (C), the flexible substrate 22 having a first surface (F) and a second surface (S) on an opposite side with respect to the first surface (F), and the multiple coils (C) being formed on the first surface (F) of the flexible substrate 22. The coils (C) formed on the first surface (F) are referred to as upper coils (CF).

As illustrated in FIG. 3, the flexible substrate 22 preferably has short sides (20T) and long sides (20L). The upper coils (CF) are formed along the long sides (20L) of the flexible substrate 22. The upper coils (CF) are formed in one row from one end to the other end of the flexible substrate 22. The number of the upper coils is N. N is a natural number. N is desirably 3 or more and 11 or less.

In FIG. 3, 1st upper coil (CF1), an m-th upper coil (CFm), an (m+1)-th upper coil (CFm1) and an N-th upper coil (CFn) are drawn.

The coils (C) are formed using a technology for a printed wiring board, and wirings (w) forming the coils (C) are formed by plating. Or, the wirings (w) forming the coils (C) are formed by etching a copper foil. The wirings (w) forming the coils (C) are formed using a semi-additive method, an M-Sap method, or a subtractive method.

The wirings (w) forming the coils (C) of the embodiment are formed using a technology for a printed wiring board.

Therefore, a cross-sectional shape of each of the wirings (w) is substantially rectangular. Since a cross section of a wire is a circle, according to the embodiment, a space factor of the coils can be increased.

The multiple coils (C) formed on the flexible substrate 22 are simultaneously formed. For example, the multiple coils (C) are formed on the flexible substrate 22 using a common alignment mark. Therefore, positions of the coils (C) are related to each other.

The coils (C) are each formed by a central space (SC) and a wiring (w) surrounding the central space (SC). The wiring (w) has an outer end (OE) and an inner end (IF). The wiring (w) is formed between the outer end (OE) and the inner end (IE). The wiring (w) forming a coil (C) is formed in a spiral shape. The central space (SC) is surrounded by the innermost turn of the wiring (w) forming the coil (C). Among multiple turns of the wiring (w), the innermost turn of the wiring (w) is an inner side wiring (wI).

In the embodiment, one coil formed by a wiring (w), an outer end (OE), an inner end (IE), and a central space (SC) is referred to as a single coil. The single coil of Patent Document 1 is different from the single coil of the embodiment. The single coil of Patent Document 1 is formed of a wire. The single coil of the embodiment is formed using a technology for a printed wiring board. The single coil of the embodiment includes a wiring (w).

The upper coils (CF) are connected to each other by connection wirings (cL). The m-th upper coil (CFm) is connected to the (m+1)-th upper coil (CFm1) by a connection wiring (cL). And, the N-th upper coil (CFn) is connected to the 1 st upper coil (CFI) by a connection wiring (cL). In this way, the upper coils (CF) are sequentially connected by the connection wirings. In FIG. 3, the connection wirings (cL) are drawn with partial omission. The connection wirings (cL) are each formed of at least one of a via conductor penetrating the flexible substrate 22, a conductor circuit on the first surface (F), and a conductor circuit on the second surface (S). It is also possible that the coils are not connected to each other by connection wirings (cL). In this case, terminals of adjacent coils are connected by solders or the like.

As illustrated in FIG. 3, the first intermediate substrate 201 of the embodiment can have terminal substrates 250 and terminals (T) formed on the terminal substrates 250. The terminal substrates 250 and the flexible substrate 22 that supports the coils (C) are formed of one flexible substrate 22.

The terminals (T) and the coils (C) are simultaneously formed. The number of the terminal substrates 250 is preferably the same as the number of the upper coils (CF). The number of the terminals (T) is preferably the same as the number of the upper coils (CF). Or, the number of the terminal substrates 250 is preferably twice the number of the upper coils (CF). The number of the terminals (T) is preferably twice the number of the upper coils (CF).

As illustrated in FIG. 3, the first intermediate substrate 201 can include multiple terminal wirings (tL) that connect the connection wirings (cL) and the terminals (T). The terminal wirings (tL) include wirings (tL) extending from the connection wiring (cL) connecting the m-th upper coil (CFm) and the (m+1)-th upper coil (CFm1), and wirings (tL) extending from the connection wiring (cL) connecting the N-th upper coil (CFn) and the 1st upper coil (CF1).

Examples of a winding direction of a coil (C) and a direction of a current flowing through a coil (C) a (first example, a second example, a third example, and a fourth example) are described below.

Figure 2A:
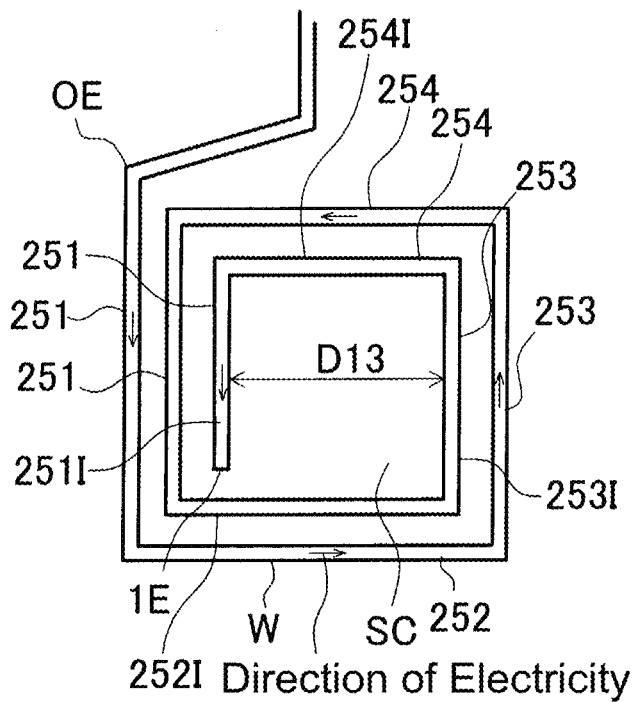
FIG. 2A illustrates a coil of a first example.

FIG. 2A illustrates a coil (C) of the first example. A current direction is drawn on the wiring (w) of the coil (C). In the coil (C) of the first example, the wiring (w) forming the coil (C) is formed in a spiral shape from the outer end (OE) to the inner end (IE). The wiring forming the coil (C) of the first example is formed counterclockwise. The current flowing through the coil (C) of the first example flows from the outer end (OE) to the inner end (IE). The current flowing through the coil (C) of the first example flows counterclockwise.

Figure 2B:
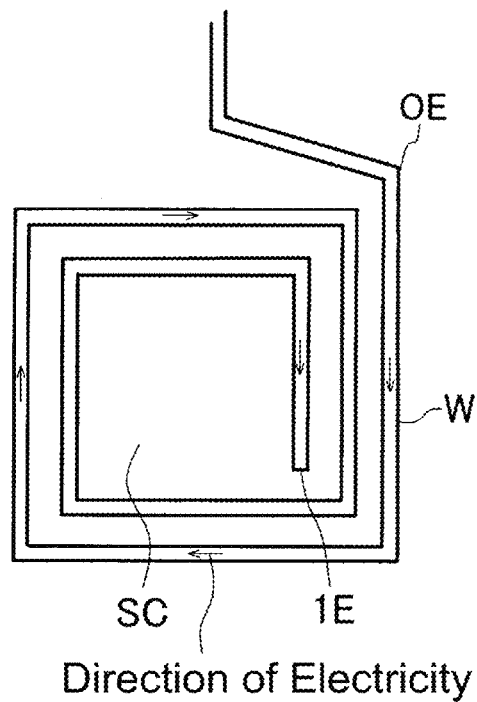
FIG. 2B illustrates a coil of a second example.

FIG. 2B illustrates a coil (C) of the second example. A current direction is drawn on the wiring (w) of the coil (C). In the coil (C) of the second example, the wiring (w) forming the coil (C) is formed in a spiral shape from the outer end (OE) to the inner end (IE). The wiring (w) forming the coil (C) of the second example is formed clockwise. The current flowing through the coil (C) of the second example flows from the outer end (OE) to the inner end (IE). The current flowing through the coil (C) of the second example flows clockwise.

Figure 2C:
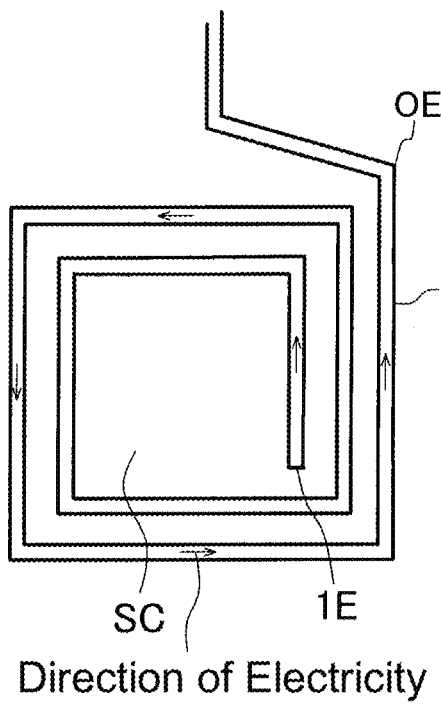
FIG. 2C illustrates a coil of a third example.

FIG. 2C illustrates a coil (C) of the third example. A current direction is drawn on the wiring (w) of the coil (C). In the coil (C) of the third example, the wiring (w) forming the coil (C) is formed in a spiral shape from the inner end (IE) to the outer end (OE). The wiring (w) forming the coil (C) of the third example is formed counterclockwise. The current flowing through the coil (C) of the third example flows from the inner end (IE) to the outer end (OE). The current flowing through the coil (C) of the third example flows counterclockwise.

Figure 2D:
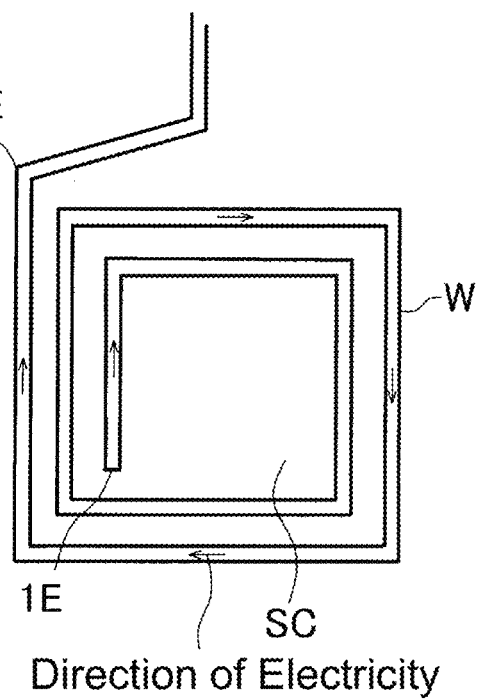
FIG. 2D illustrates a coil of a fourth example.

FIG. 2D illustrates a coil (C) of the fourth example. A current direction is drawn on the wiring (w) of the coil (C). In the coil (C) of the fourth example, the wiring (w) forming the coil (C) is formed in a spiral shape from the inner end (IE) to the outer end (OE). The wiring (w) forming the coil (C) of the fourth example is formed clockwise. The current flowing through the coil (C) of the fourth example flows from the inner end (IE) to the outer end (OE). The current flowing through the coil (C) of the fourth example flows clockwise.

In the first intermediate substrate 201, the winding direction of the coil (C) in each of the first example, the second example, the third example, and the fourth example is defined by observing the coil (C) from a position above the first surface (F).

In the first intermediate substrate 201, the direction of the current flowing through the coil (C) in each of the first example, the second example, the third example, and the fourth example is defined by observing the coil (C) from a position above the first surface (F).

In the embodiment, the winding direction of the m-th upper coil (CF) and the winding direction of the (m+1)-th upper coil (CF) are different from each other. Examples of combinations are described below.

First Example of m-th Upper Coil (CF) and (m+1)-th Upper Coil (CF)

The m-th upper coil (CF) is a coil (C) of the first example, and the (m+1)-th upper coil (CF) is a coil (C) of the second example.

Second Example of m-th Coil (CF) and m+1)-th Upper Coil (CF)

The m-th upper coil (CF) is a coil (C) of the second example, and the (m+1)-th upper coil (CF) is a coil (C) of the first example.

Third Example of m-th Upper Coil (CF) and (m+1)-th Upper Coil (CF)

The m-th upper coil (CF) is a coil (C) of the third example, and the (m+1)-th upper coil (CF) is a coil (C) of the fourth example.

Fourth Example of m-th Upper Coil (CF) and (M+1)-th Upper Coil (CF)

The m-th upper coil (CF) is a coil (C) of the fourth example, and the (m+1)-th upper coil (CF) is a coil (C) of the third example.

In the first intermediate substrate 201 of the embodiment, the winding directions of adjacent coils (C) are opposite with respect to each other. The winding direction of the m-th upper coil (CF) and the winding direction of the (m+2)-th upper coil (CF) are the same. For example, when the m-th upper coil (CF) is a coil (C) of the first example, the (m+2)-th upper coil (CF) is also a coil (C) of the first example.

Figure 1C:
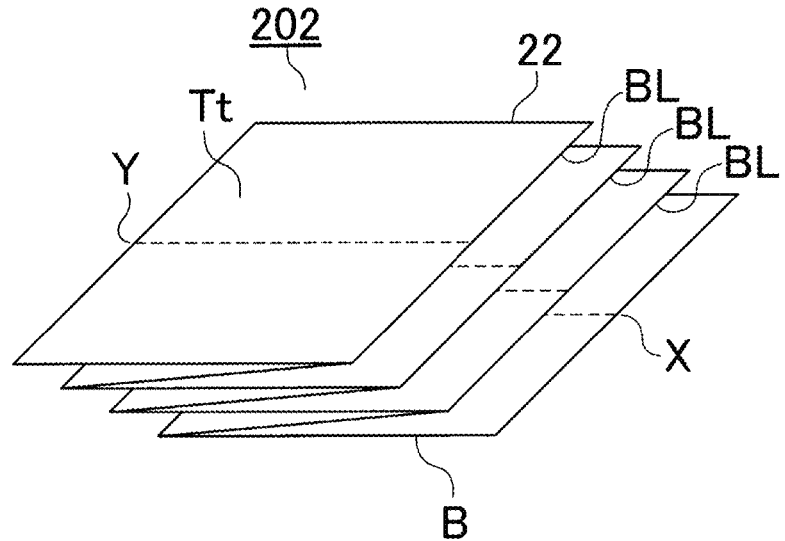
FIG. 1C illustrates a second intermediate substrate.

The flexible substrate 22 illustrated in FIG. 3 is folded along folding lines (BL). The folded flexible substrate 22 illustrated in FIG. 1C is obtained. A second intermediate substrate 202 is formed by the folded flexible substrate 22 and the coils formed on the flexible substrate. The folding lines (BL) exist between adjacent upper coils (CF).

As illustrated in FIG. 1C, the second intermediate substrate 202 has a bottom surface (B) and a top surface (Tt) on an opposite side with respect to the bottom surface (B). The bottom surface (B) is a lowermost surface of the second intermediate substrate 202, and the top surface (Tt) is an uppermost surface of the second intermediate substrate 202.

The flexible substrate 22 is folded such that the first surface (F) and the first surface (F) face each other. Subsequently, the flexible substrate 22 is folded such that the second surface (S) and the second surface (S) face each other. Then, the flexible substrate 22 is folded such that the first surface (F) and the first surface (F) face each other. In this way, the flexible substrate 22 is folded such that the first surfaces (F) and the second surfaces (S) alternately face each other. As illustrated in FIG. 1C, the flexible substrate 22 is folded such that a stairway is formed in one direction from the bottom surface (B) to the top surface (Tt).

Figure 4A:
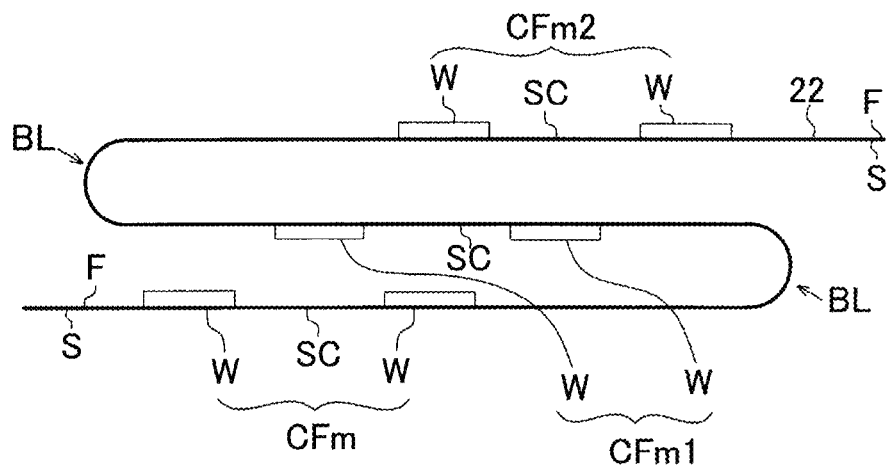
FIG. 4A illustrates a cross section of the second intermediate substrate.
Figure 4B:
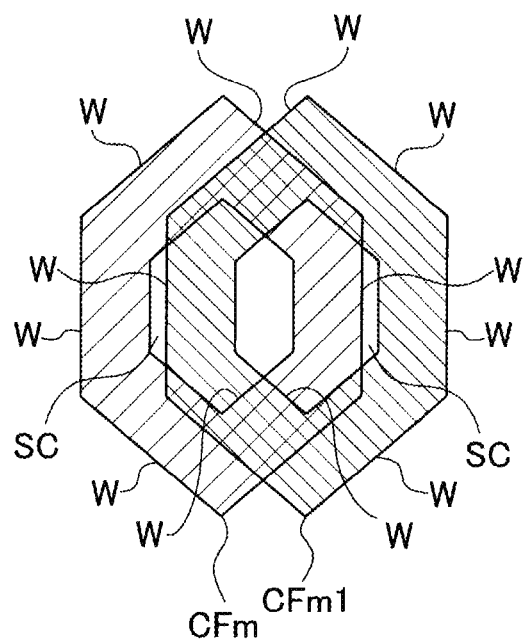
FIG. 4B illustrates overlapping of coils.

FIG. 4A illustrates a cross section of the second intermediate substrate 202 positioned between X and Y illustrated in FIG. 1C. Further, FIG. 4B illustrates the m-th upper coil (CFm) and the (m+1)-th upper coil (CFm1) observed from a position (W) above the top surface (Tt) of the second intermediate substrate 202. In FIGS. 4A and 4B, the wirings (w) forming the upper coils (CF) are drawn with partial omission. In FIG. 4B, the wirings (w) are each collectively drawn with oblique lines.

As illustrated in FIGS. 4A and 4B, in the embodiment, the first intermediate substrate 201 is folded such that the m-th upper coil (CFm) and the (m+1)-th upper coil (CFm1) partially overlap each other. In the second intermediate substrate 202, the (m+1)-th upper coil (CFm1) is laminated on the m-th upper coil (CFm) such that the m-th upper coil (CFm) and the (m+1)-th upper coil (CFm1) partially overlap each other. The m-th upper coil (CFm) and the (m+1)-th upper coil (CFm1) do not completely overlap each other. In the embodiment, by folding the flexible substrate 22, the coils (C) fainted on the flexible substrate 22 can be stacked on each other. Therefore, the coils (C) can be stacked on each other with high accuracy. Therefore, the space factor of the coils can be efficiently increased. Conductor resistance of the coils is lowered. A motor having high efficiency can be provided.

The flexible substrate is folded such that a part of the m-th single coil and a part of the (m+1)-th single coil overlap each other. The flexible substrate is folded such that the m-th single coil and the (m+1)-th single coil partially overlap each other. The flexible substrate is preferably folded such that the (m+1)-th wiring is positioned on the central space of the m-th single coil.

In FIGS. 4A and 4B, a part of the wiring of the (m+1)-th upper coil (CFm1) is positioned on the central space (SC) of the m-th upper coil (CFm). The wiring of (m+1)-th upper coil (CFm1) positioned on the central space (SC) of the m-th upper coil (CFm) does not overlap with the wiring of the m-th upper coil (CFm). The space factor of the coils can be efficiently increased. It is also possible that the wiring of (m+1)-th upper coil (CFm1) positioned on the central space (SC) of the m-th upper coil (CFm) partially overlaps with the wiring of the m-th upper coil (CFm).

In the first intermediate substrate 201, the winding directions of adjacent coils are opposite with respect to each other. However, by folding the flexible substrate 22 between adjacent coils, the winding directions of coils are the same. The directions of the currents flowing through the coils are the same. A torque of the motor can be increased. The winding directions of the coils formed on the second intermediate substrate 202 are observed from the position (W). The directions of the current flowing through the coils formed on the second intermediate substrate 202 are observed from the position (W).

The directions of the currents flowing through the single coils on the flexible substrate before folding are described below. The direction of the current flowing through the m-th single coil and the direction of the current flowing through the (m+1)-th single coil are opposite with respect to each other. The directions of the currents flowing through the single coils are observed from a position above the first surface (F).

In the second intermediate substrate, the direction of the current flowing through the m-th single coil and the direction of the current flowing through the (m+1)-th single coil are the same. The directions of the currents flowing through the single coils are observed from the position (W).

By winding the second intermediate substrate 202, the motor coil substrate 20 is obtained. The second intermediate substrate 202 is wound around a cavity. An example of a shape of the motor coil substrate 20 is a cylindrical shape.

The motor coil substrate 20 is positioned around the magnet 48 such that the top surface (Tt) and the magnet 48 oppose each other. Or, the motor coil substrate 20 is positioned around the magnet 48 such that the bottom surface (B) and the magnet 48 oppose each other. The motor 10 including the magnet 48 and the motor coil substrate 20 is completed. Since the folded flexible substrate 22 is positioned around the magnet 48, the positional relationship between the m-th upper coil (CFm) and the (m+1)-th upper coil (CFm1) can be maintained. The positional relationship between m-th single coil and (m+1)-th single coil can be maintained. A motor having high efficiency can be provided.

Modified Embodiments

By adding multiple coils on the second surface (S) of the flexible substrate 22 of the embodiment, a first intermediate substrate 201 of a modified embodiment is formed. A coil (C) on the second surface (S) is referred to as a lower coil (CS). The upper coils (CF) respectively oppose the lower coils (CS) via the flexible substrate 22. When the lower coils (CS) are projected on the first surface (F) with light perpendicular to the first surface (F), the upper coils (CF) respectively substantially overlap with the lower coils (CS). Winding directions of an upper coil (CF) and a lower coil (CS)

that oppose each other are the same. Directions of currents flowing through an upper coil (CF) and a lower coil (CS) that oppose each other are the same. In the first intermediate substrate 201, the winding directions of the coils (C) and the directions of the currents flowing through the coils (C) are observed from a position above the first surface (F).

The method for folding the flexible substrate 22 is the same in the embodiment and the modified embodiment of the embodiment. The method for winding the folded flexible substrate 22 is the same in the embodiment and the modified embodiment of the embodiment. The method for winding the folded flexible substrate 22 around a cavity is the same in the embodiment and the modified embodiment of the embodiment.

The electric motor of Japanese Patent Application Laid-Open Publication No. 2007-124892 includes multiple single coils formed of wires. The coils are formed of wires. When the wires are thin, it is thought to be difficult to wind the wires. It is thought that the wires break. Since the coils are formed of wires, it is thought to be difficult to increase a space factor. According to FIG. 6 of Japanese Patent Application Laid-Open Publication No. 2007-124892, the single coils are stacked on each other. It is thought to be difficult to stack the single coils formed of wires with high positional accuracy.

A motor coil substrate according to an embodiment of the present invention includes a flexible substrate and multiple coils formed on the flexible substrate. The motor coil substrate is formed by folding the flexible substrate such that adjacent coils partially overlap each other and by winding the folded flexible substrate.

A method for manufacturing a motor coil substrate according to an embodiment of the present invention include: forming multiple coils on a flexible substrate; folding the flexible substrate such that an m-th coil and an (m+1)-th coil partially overlap each other; and winding the folded flexible substrate. According to an embodiment of the present invention, the coils are formed of wirings. For example, the coils can be formed using a technology for a printed wiring board. Therefore, each of the wirings forming the coils can be formed to have a substantially rectangular shape in a cross-section. Further, by folding the flexible substrate, adjacent coils partially overlap each other. The coils can be stacked on each other with high positional accuracy. By winding the folded flexible substrate, a motor coil is formed. Therefore, a space factor of the coils can be increased. A motor coil having high efficiency can be provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A motor coil substrate, comprising:
a flexible substrate; and
a plurality of coils formed on the flexible substrate such that each of the coils has a spiral shape and that each of the coils has a central space and a wiring surrounding the central space,
wherein the flexible substrate has a plurality of folding lines formed and the plurality of coils positioned such that the flexible substrate is configured to be folded at the folding lines and wound around a magnet and that when the flexible substrate is folded at the folding lines, an m-th coil and an (m+1)-th coil of the plurality of coils partially overlap one another, and the wiring of the (m+1)-th coil is positioned to cross the central space of the m-th coil.

2. The motor coil substrate according to claim 1, wherein the plurality of coils is formed such that the wiring of each of the coils is formed by a subtractive method.

3. The motor coil substrate according to claim 1, wherein the plurality of coils is formed such that the wiring of each of the coils is formed by an additive method.

4. The motor coil substrate according to claim 1, wherein the flexible substrate is configured to be wound in a cylindrical shape such that the flexible substrate forms a space between the magnet and the flexible substrate wound around the magnet.

5. The motor coil substrate according to claim 1, wherein the flexible substrate is configured to be wound such that the flexible substrate forms a space between the magnet and the flexible substrate wound around the magnet.

6. The motor coil substrate according to claim 1, wherein the plurality of coils are formed such that current flows through adjacent coils on the flexible substrate in opposite directions with respect to each other and that the currents flows through adjacent coils on the flexible substrate folded at the folding lines in a same direction.

7. The motor coil substrate according to claim 4, wherein the plurality of coils are formed such that current flows through adjacent coils on the flexible substrate in opposite directions with respect to each other and that the currents flows through adjacent coils on the flexible substrate folded at the folding lines in a same direction.

8. The motor coil substrate according to claim 5, wherein the plurality of coils are formed such that current flows through adjacent coils on the flexible substrate in opposite directions with respect to each other and that the currents flows through adjacent coils on the flexible substrate folded at the folding lines in a same direction.

9. A motor, comprising:
a magnet; and
the motor coil substrate of claim 1.

10. A motor, comprising:
a magnet; and
the motor coil substrate of claim 4.

11. A motor, comprising:
a magnet; and
the motor coil substrate of claim 5.

12. A motor, comprising:
a magnet; and
the motor coil substrate of claim 6.

13. A motor coil substrate, comprising:
a flexible substrate; and
a plurality of coils formed on the flexible substrate such that each of the coils has a spiral shape,
wherein the flexible substrate has a plurality of folding lines formed and the plurality of coils positioned such that the flexible substrate is configured to be folded at the folding lines and wound around a magnet and that an m-th coil and an (m+1)-th coil of the plurality of coils partially overlap one another when folded at the folding lines, and the plurality of coils are formed such that current flows through adjacent coils on the flexible substrate in opposite directions with respect to each other and that the currents flows through adjacent coils on the flexible substrate folded at the folding lines in a same direction.

14. The motor coil substrate according to claim 13, wherein the flexible substrate is configured to be wound in a cylindrical shape such that the flexible substrate forms a space between the magnet and the flexible substrate wound around the magnet.

15. The motor coil substrate according to claim 13, wherein the flexible substrate is configured to be wound such that the flexible substrate forms a space between the magnet and the flexible substrate wound around the magnet.

16. The motor coil substrate according to claim 13, wherein the plurality of coils is formed such that each of the coils has a central space and a wiring surrounding the central space.

17. The motor coil substrate according to claim 16, wherein the flexible substrate is configured to be wound in a cylindrical shape such that the flexible substrate forms a space between the magnet and the flexible substrate wound around the magnet.

18. The motor coil substrate according to claim 16, wherein the flexible substrate is configured to be wound such that the flexible substrate forms a space between the magnet and the flexible substrate wound around the magnet.

19. A motor, comprising:
a magnet; and
the motor coil substrate of claim 13.

20. A method for manufacturing a motor coil substrate, comprising:
forming a plurality of coils on a flexible substrate such that each of the coils has a spiral shape;
folding the flexible substrate at a plurality of folding lines such that an m-th coil and an (m+1)-th coil of the coils partially overlap one another; and
winding the folded flexible substrate such that the flexible substrate is configured to form a space between a magnet and the flexible substrate wound around the magnet,
wherein the forming of the coils includes forming each of the coils having a central space and a wiring surrounding the central space, and the folding includes positioning the wiring of the (m+1)-th coil to cross the central space of the m-th coil.

* * * * *